US012772429B2

(12) United States Patent
Huang et al.

(10) Patent No.: US 12,772,429 B2
(45) Date of Patent: Oct. 20, 2026

(54) SEMICONDUCTOR DEVICES WITH FRONTSIDE AND BACKSIDE POWER RAILS

(71) Applicant: Taiwan Semiconductor Manufacturing Company, Ltd., Hsin-Chu (TW)

(72) Inventors: Yu-Xuan Huang, Hsinchu (TW); Ching-Wei Tsai, Hsinchu City (TW); Yi-Hsun Chiu, Hsinchu County (TW); Hou-Yu Chen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 579 days.

(21) Appl. No.: 18/159,878

(22) Filed: Jan. 26, 2023

(65) Prior Publication Data

US 2024/0008243 A1 Jan. 4, 2024

Related U.S. Application Data

(60) Provisional application No. 63/382,224, filed on Nov. 3, 2022, provisional application No. 63/357,078, filed on Jun. 30, 2022.

(51) Int. Cl.

*H10B 10/00* (2023.01)
*G11C 5/14* (2006.01)

(52) U.S. Cl.

CPC ............. *H10B 10/18* (2023.02); *G11C 5/147* (2013.01)

(58) Field of Classification Search

CPC ........ H10B 10/18; G11C 5/147; G11C 5/025; H10D 89/10; H10D 84/0126; H10D 84/0149; H10D 84/038; H10D 84/981; H01L 23/481; H01L 23/5286

See application file for complete search history.

(56) References Cited

U.S. PATENT DOCUMENTS

| | | | | |
|---|---|---|---|---|
| 7,359,272 | B2 | 4/2008 | Wang et al. | |
| 9,218,872 | B1 | 12/2015 | Liaw | |
| 10,923,184 | B2 | 2/2021 | Jain et al. | |
| 11,749,670 | B2 * | 9/2023 | Liu | H10D 89/10 257/401 |
| 2017/0110164 | A1 | 4/2017 | Cheng et al. | |
| 2018/0342291 | A1 | 11/2018 | We et al. | |

(Continued)

FOREIGN PATENT DOCUMENTS

| | | | |
|---|---|---|---|
| TW | 202042319 | A | 11/2020 |
| TW | 202129891 | A | 8/2021 |

(Continued)

*Primary Examiner* — Allison Bernstein
(74) *Attorney, Agent, or Firm* — HAYNES AND BOONE, LLP

(57) ABSTRACT

A semiconductor device includes multiple transistors formed in a substrate, a frontside power rail disposed on a frontside of the substrate, and a backside power rail disposed on a backside of the substrate. The transistors form at least a first cell functioning under a first power supply voltage and a second cell functioning under a second power supply voltage that is different from the first power supply voltage. The frontside power rail provides the first power supply voltage to the first cell, and the backside power rail provides the second power supply voltage to the second cell.

20 Claims, 11 Drawing Sheets

(56) References Cited

U.S. PATENT DOCUMENTS

| | | | |
|---|---|---|---|
| 2021/0225830 A1 | 7/2021 | Liu | |
| 2021/0336001 A1* | 10/2021 | Yang | H10D 84/038 |
| 2021/0343332 A1 | 11/2021 | Chiu et al. | |
| 2021/0343744 A1 | 11/2021 | Chiu et al. | |
| 2021/0375761 A1 | 12/2021 | Chang et al. | |
| 2021/0375861 A1 | 12/2021 | Chung et al. | |
| 2022/0045011 A1 | 2/2022 | Sio et al. | |
| 2022/0130760 A1 | 4/2022 | Wu et al. | |
| 2022/0130968 A1 | 4/2022 | Peng et al. | |
| 2022/0181258 A1 | 6/2022 | Liebmann et al. | |

FOREIGN PATENT DOCUMENTS

| | | |
|---|---|---|
| TW | 202133324 A | 9/2021 |
| TW | 202205614 A | 2/2022 |
| TW | 202209163 A | 3/2022 |
| TW | 202209495 A | 3/2022 |

* cited by examiner

SEMICONDUCTOR DEVICES WITH FRONTSIDE AND BACKSIDE POWER RAILS

PRIORITY

This application claims the benefits of U.S. Prov. App. Ser. No. 63/357,078, filed Jun. 30, 2022 and U.S. Prov. App. Ser. No. 63/382,224, filed Nov. 3, 2022, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Integrated circuits may be built in a stacked-up fashion, having transistors at the lowest level and interconnect (vias and wires) on top of the transistors to provide connectivity to the transistors. Power rails (such as metal lines for voltage sources and ground planes) may also be above the transistors and may be part of the interconnect. As the integrated circuits continue to scale down, so do the power rails. This leads to increased voltage drop across the power rails, as well as increased power consumption of the integrated circuits. Therefore, although existing approaches in semiconductor fabrication have been generally adequate for their intended purposes, they have not been entirely satisfactory in all respects. One area of interest is how to form power rails on both the frontside and backside of an integrated circuit. Therefore, there is a need for power rail structures for integrated circuits to address these concerns with enhanced circuit performance and reliability, and increased packing density.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
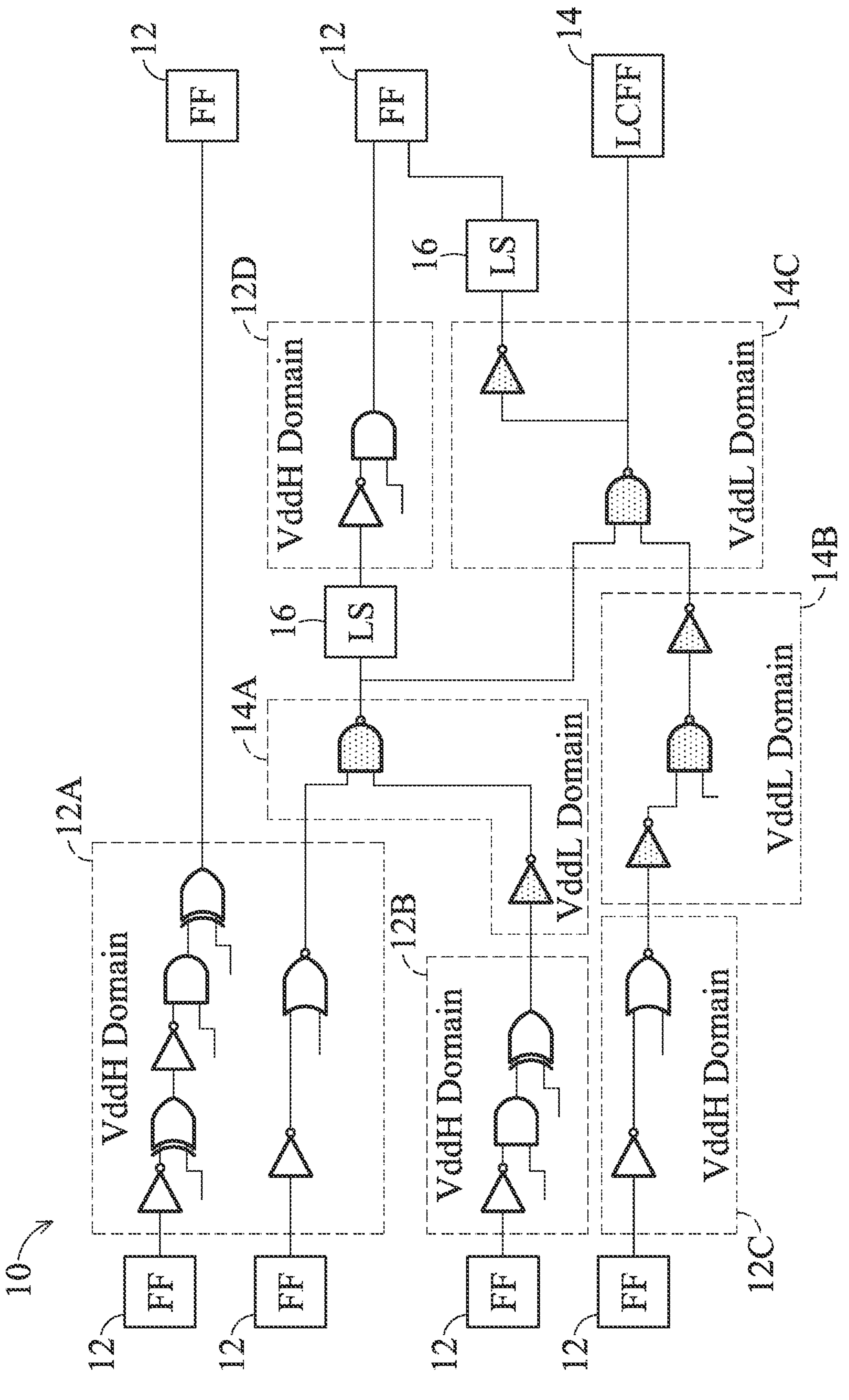
FIG. 1 is a schematic view of a circuit having multiple voltage domains, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure provides various embodiments of semiconductor devices with frontside and backside power rails. Particularly, the present disclosure provides various embodiments of distributing different power supply voltages from multiple voltage domains to cell level or transistor level through frontside and backside power rails.

Semiconductor devices can be manufactured on a substrate, usually but not necessarily made of silicon or other suitable semiconducting materials. Semiconductor devices can have circuit blocks that provide certain functionalities. These circuit blocks may be referred to as "cells." A semiconductor device may comprise a plurality of cells. The cells may be customarily designed or provided from standard cell libraries. The layout of a customarily designed cell may be drawn by a circuit designer. The provider of standard cell libraries may provide the layout of their cells as well as other characteristics, such as timing performance and electrical parameters.

Cells require power for proper functioning. On a substrate, power may be distributed by a network made of conductive materials, such as metal lines and vias. The power distribution network is also referred to as power rails. Power rails provide one or more conductive paths arranged between a cell and a voltage domain. A voltage domain can provide a reference voltage by virtue of being connected to a power supply. An example is Vdd, which supplies a positive voltage of a certain magnitude. Conventionally, an integrated circuit may have a single positive voltage domain (another voltage domain is Vss, which provides a ground reference). For a single positive voltage domain, all the cells in the integrated circuit are powered by Vdd.

Not all the cells need to operate under the same voltage domain. Taking memory devices, such as static-random-access memory (SRAM) circuits, as an example, memory devices are subject to a phenomenon known as leakage power. Leakage power is typically dissipated by logic in the periphery and core memory arrays whenever the memory is powered on. As technology continues to shrink device features below sub-nanometer geometries, leakage power dissipation in a memory device increases. This leakage power is becoming a significant factor of the total power dissipation in a memory device. One way to reduce leakage power is to reduce the power supply voltage for a memory device. However, the voltage level of a bit cell in the memory needs to be maintained at a minimum voltage specification for retention, while periphery sections of the memory device can operate below the specified voltage.

Implementing multiple voltage domains is an effective way to suppress leakage power and reduce power consumption. High voltage (denoted as VddH) is applied to the critical function blocks or paths, while low voltage (denoted as VddL) is applied to non-critical function blocks or paths. This method not only reduces power but also maintains circuit performance.

FIG. 1 illustrates an example circuit 10 with multiple voltage domains implemented at a cell level or even a level lower—at transistor level. The circuit 10 includes logic gates of clusters 12A, 12B, 12C, 12D assigned a voltage domain of a higher voltage VddH, which are logic gates on critical paths. The circuit 10 also includes logic gates of clusters 14A, 14B, 14C assigned another voltage domain of a lower voltage VddL, which are logic gates on non-critical paths. Level shifters (LS s) need to be inserted into logic gates in the VddL domain fanin to the logic gates in the VddH domain, such as the LS 16 inserted between the cluster 14A in the VddL domain and cluster 12D in the VddH domain. Flip-flops (FFs) 12 and level-converter flip flops (LCFF) 14 provide input/output (I/O) of the circuit 10. The FFs 12 provide direct input and output connection to the clusters in the VddH domain. To couple a cluster in the VddL domain to an FF 12, a LS is needed for voltage domain conversion, such as the LS 16 inserted between the cluster 14C in the VddL domain and the FF 12. Meanwhile, LCFFs may provide direct output connection to the clusters in the VddL domain, such as the LCFF 14 directly coupled to the cluster 14C in the VddL domain without a need of an extra LS.

Back to the above example of memory device, multiple voltage domains allow the periphery and core of a memory device operate with different power supplies at different voltages, in an effort to reduce leakage power. Memory device with multiple voltage domains use level shifters to isolate a high-voltage domain (e.g., VddH) for one group of cells (or transistors) from a low-voltage domain (e.g., VddL) for another group of cells (or transistors) and convert signal voltages by the level shifters to an appropriate domain. Multiple voltage domains inevitably require multiple power rails. Further, to implement multiple voltage domains at cell level or transistor level, power rails of different voltage domains may need to interleave.

Figure 2:
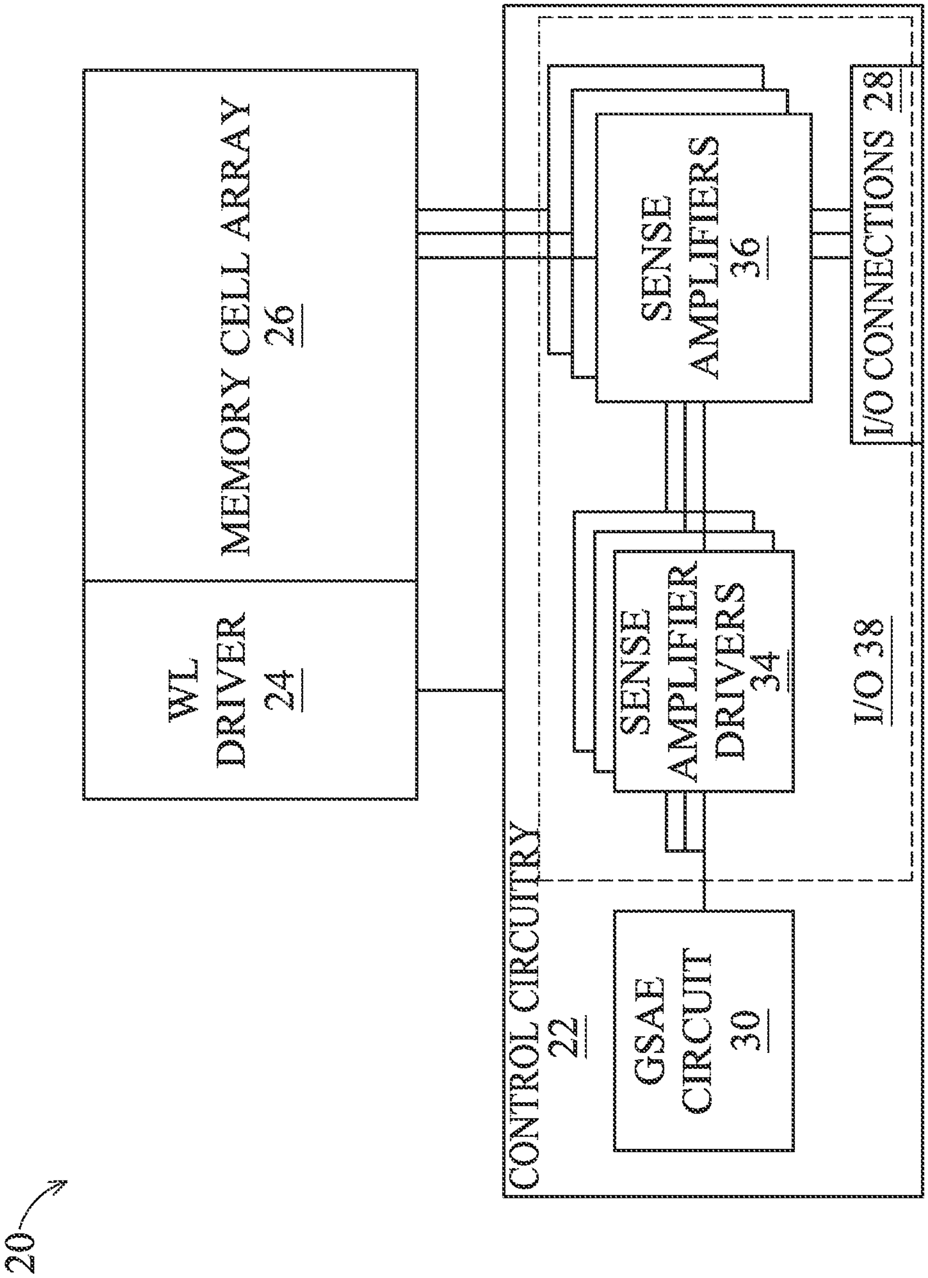
FIG. 2 is a schematic view of a memory circuit, in accordance with some embodiments of the present disclosure.

FIG. 2 depicts a block diagram of a memory circuit 20 in accordance with one or more embodiments. In embodiments, a memory circuit comprises control circuitry 22, a word-line driver 24, a memory cell array 26, and I/O circuitry 38. The memory cell array 26 stores data in individual memory cells; each cell capable of storing one bit. Memory cells in the memory cell array 26 are addressable by their respective intersection with an individually selectable word line, corresponding to a row of data bits, which may be of any suitable length, and an individual column, or bit line. A word line is selected and driven by a word-line driver 24. The word-line driver 24 receives control signals from the control circuitry 22, and in response selects and causes an individually addressed word line to be asserted. Responsive to an asserted word line, data stored within memory cells within the memory cell array 26 that are associated with an asserted word-line are gated onto their respective bit lines. The control circuit 22 may also include a column selector, for selecting individual bit lines or ranges of bit lines to be delivered to the IO connections 28. Bit lines are associated with sense amplifiers 36. When a word line is activated, the control circuitry 22 includes timing circuitry for enabling the sense amplifiers 36 at the appropriate time to coincide with, e.g., a read operation. Sense amplifiers 36 are driven by sense amplifier drivers 34. The sense amplifiers 36, sense amplifier drivers 34, and I/O connections 28 may be collectively referred to as I/O circuitry 38. Each sense amplifier drivers 34 is enabled by an individual local sense amplify enable signal. Each local sense amplifier enable signal is generated responsive to a global sense amplifier enable (GSAE) signal generated by a GSAE circuit 30. This GSAE signal may be generated in response to a bit line read enable signal generated by the memory application's control circuitry.

Figure 3:
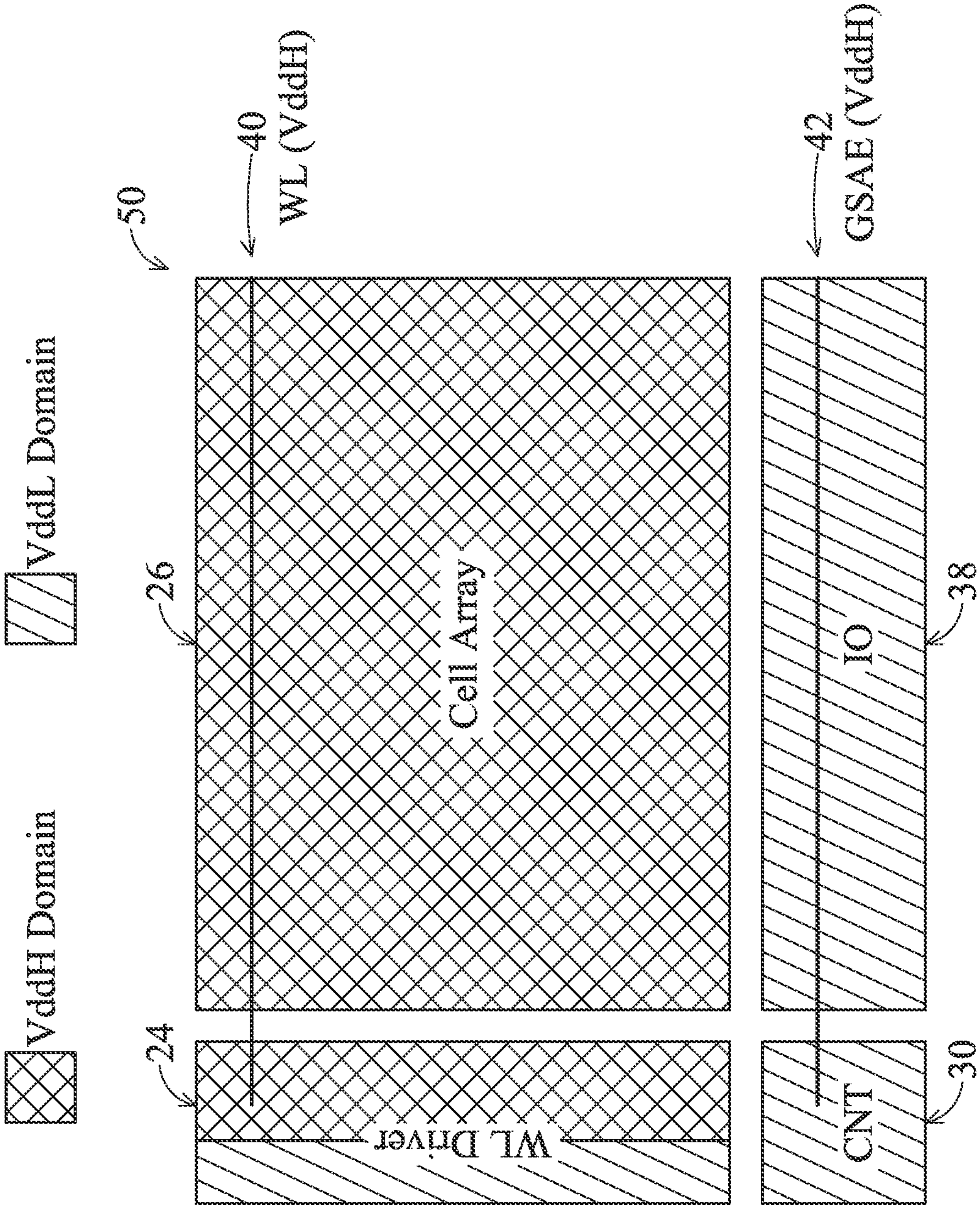
FIG. 3 is a chart showing different voltage domains of the memory circuit in FIG. 2, in accordance with some embodiments of the present disclosure.

FIG. 3 depicts a chart 50 illustrating the power domains from which components in FIG. 2 receive respective voltage supplies. The GSAE circuitry 30, the I/O circuitry 38, and the word line driver 24 may be supplied by VddL from the low-voltage domain (VddL domain). On the other hand, memory cell array 26, the word line 40, and the GSAE signal 42 may be supplied by VddH from the high-voltage domain (VddH domain). As illustrated, word line driver 24 may include control components supplied by VddL, while the word line 40 itself may be supplied by VddH as the word line 40 needs to be delivered into the memory cell array 26 in the VddH domain. Similarly, the GSAE circuitry 30 may include control components supplied by VddL, while the GSAE signal 42 itself may be supplied by VddH. One consideration is that the GSAE signal may be buffered to avoid clock skew by lengthy propagation to more distant sense amplifiers in the circuit, and supplying GASE with VddH reduces any fan-out issues caused by propagating the GSAE to many drivers. In the illustrated memory circuit 20, at least three circuit blocks, namely word line driver 24, GSAE circuitry 30, and I/O circuitry 38, are operating under dual voltage domains. Level shifters may be inserted in these circuit blocks for internal transitions from a low-voltage domain to a high-voltage domain at cell level or transistor level.

Semiconductor devices, including memory circuits, are often built in a stacked-up fashion, having transistors at the lowest level and interconnect (vias and wires) on top of the transistors to provide connectivity to the transistors. Power rails are also above the transistors and may be part of the interconnect. To provide multiple voltage domains to cell level or transistor level, power rails of different voltage domains may need to be interleaved. As the integrated circuits continue to scale down, so do the power rails. Interleaving power rails of different voltage domains becomes quite challenging. To fit multiple power rails into a limited chip area, voltage drop across the power rails often increases, which in turn increases power consumption of the integrated circuits and offsets the benefits of bringing in a low-voltage domain.

An extra power rail may be provided on the backside of a substrate in addition to the power rail on the frontside of the substrate. The frontside power rail may be devoted to one voltage domain, and the backside power rail may be devoted to another voltage domain. Or, one of the power rails may be devoted to a single voltage domain, and another may be devoted to dual voltage domains. One benefit of implementing the backside power rail is the ability to separate dual voltage domains on the frontside and the backside, respectively, without (or reducing) competition for routing area, and/or the ability to reserve more areas on the frontside for circuit elements such as logic and memory.

The substrate on which semiconductor devices are made may be one-sided or two-sided. For one-sided substrates, the terms "front side," "front-side" and "frontside" typically refer to the side on which circuit elements or devices (such as passive devices and active devices) are present, whereas the terms "backside," "back-side" or "back side," usually without circuit elements, typically refer to the side opposite the front side. For two-sided substrates, "frontside" and similar terms still typically refer to the side on which circuit elements or devices are made, but there may also be circuit elements on the "backside." In the present disclosure, for two-sided substrates, the "frontside" and similar terms typically refer to the side on which most of the active circuit elements (such as transistors and other circuits formed by the transistors, such as logic gates and memory), whereas the "backside" usually has fewer, if any, active circuit elements.

Figure 4A:
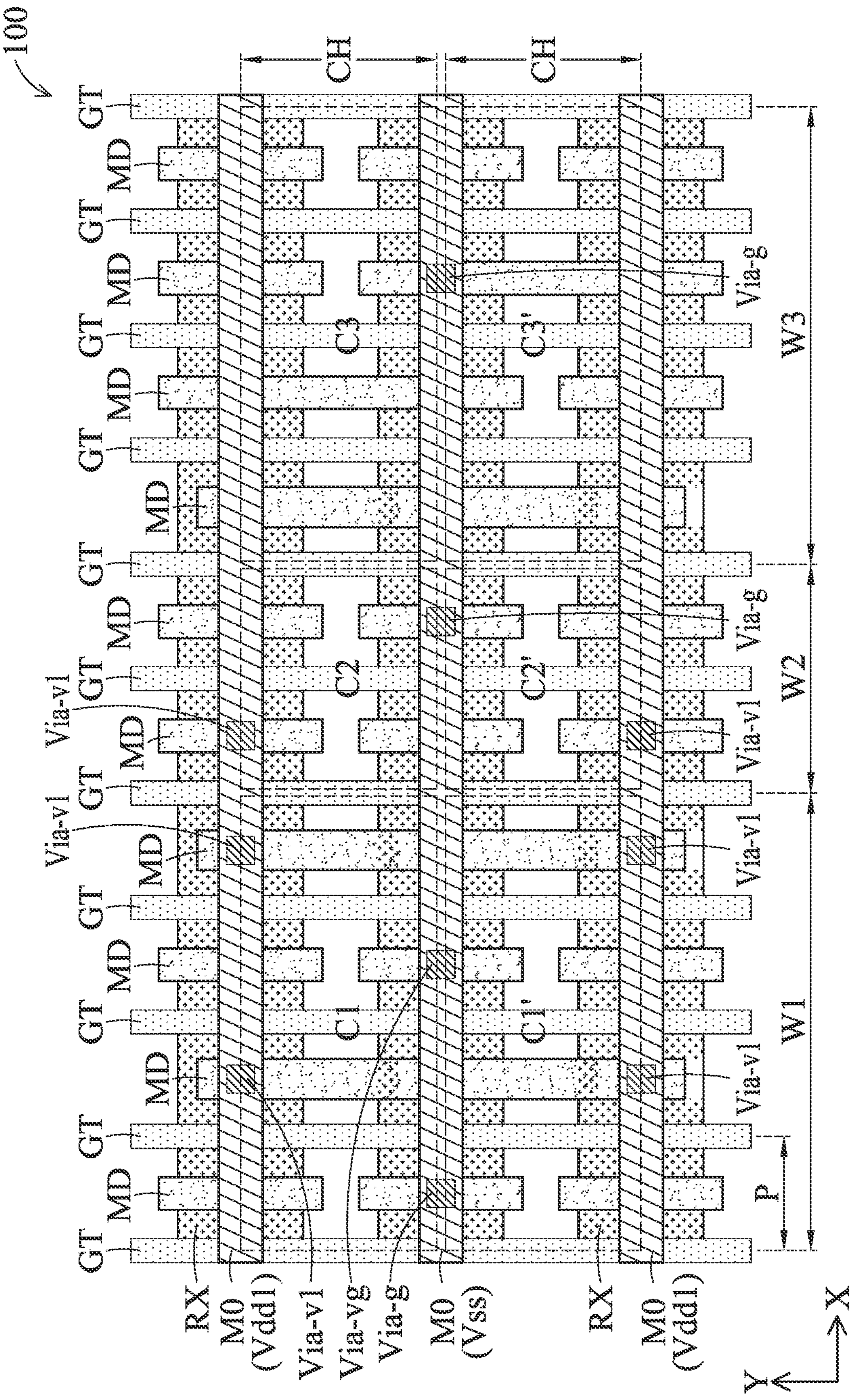
FIGS. 4A and 4B are frontside and backside views of a layout of multiple cells functioning at multiple voltage domains, respectively, in accordance with some embodiments of the present disclosure.
Figure 4B:
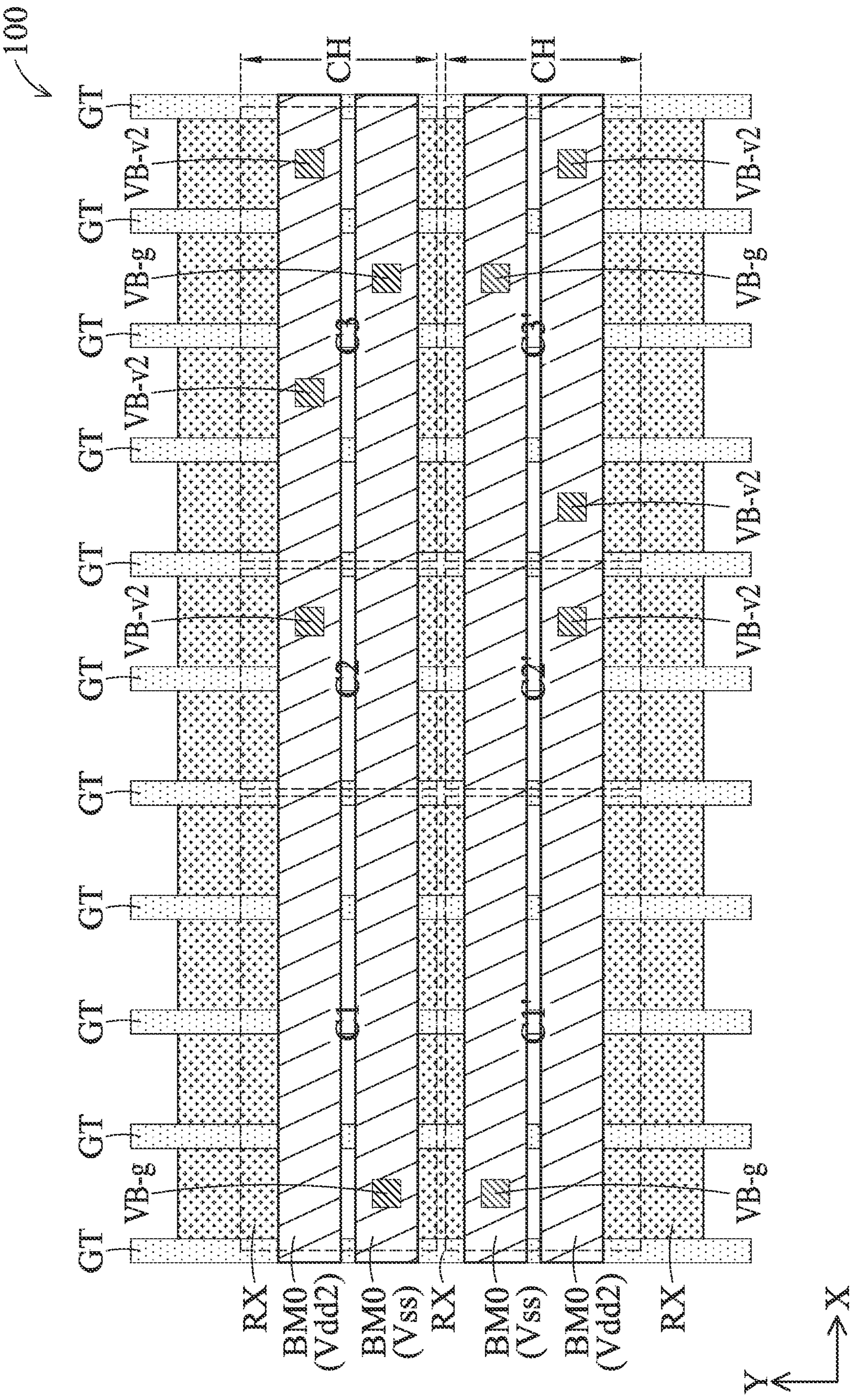

FIGS. 4A and 4B are layout views of a semiconductor device 100 in accordance with some embodiments of the present disclosure. The semiconductor device 100 may be made on two sides of a substrate. In the illustrated embodiments, FIG. 4A illustrates a frontside and FIG. 4B illustrates a backside.

The semiconductor device 100 includes a plurality of cells. The boundary of some of the cells in FIGS. 4A and 4B is indicated with dashed rectangles. In some embodiments, these cells may form one or more combined cells. In the illustrated embodiment, six cells, namely C1, C2, C3, C1', C2', and C3' are shown. The cells C1, C2, and C3 are arranged in sequence along the X-direction. The cells C1', C2', and C3' are arranged in sequence along the X-direction. Further, the cells C1', C2', and C3' are image reflection of the cells C1, C2, and C3 along the X-axis.

Taking the cells C1-C3 as an example, the boundary of the cells is indicated: the cell C2 in the middle of the semiconductor device 100, and the cells C1 and C3 abut opposing boundaries of the cell C2. All three cells are illustrated as extending in the X-direction with different widths, referred to as "cell width." The cell C1 has a cell width W1, the cell C2 has a cell width W2, and the cell C3 has a cell width W3. The cell width W2 may be smaller than other two cell widths. The height of the cells in the Y-direction may be referred to as "cell height." In the illustrated embodiment, all three cells have a cell height CH. The cells C1-C3 with the cell height CH may form a combined standard cell with the cell height CH that can be repeated (e.g., cells C1', C2', and C3') to form a larger layout. In some other embodiments, the cell heights may be different. For example, the cells C1 and C3 may have a cell height that is twice the cell height of the cell C2.

Referring to FIG. 4A, the semiconductor device 100 may have several elements in different regions. The elements may include diffusion regions RX, gates GT, metal M0 (metal layer 0), metal MD, and vias. Some of the elements may form one cell. Conversely, one cell may include several elements. These elements may form circuits such as transistors, logic, memory, and other circuits that can be manufactured. In various embodiments, the depicted cells C1-C3 are a portion of a memory device as illustrated in FIGS. 2 and 3, such as a portion of the word line driver 24, GSAE circuitry 30, or I/O circuitry 38 as discussed above. Note that the semiconductor device 100 may have other elements not illustrated in FIGS. 4A and 4B.

The substrate on which the semiconductor device 100 is manufactured may be made of semiconducting materials such as silicon or germanium or appropriate alloys. The diffusion regions RX may be doped with impurities to alter the electrical characteristics of the substrate material. In the illustrated embodiment, the diffusion regions RX extend in the X-direction. The diffusion regions RX may also be referred to as active regions. The diffusion regions RX may form, for example, the source/drain (S/D) regions of a Field-Effect Transistor (FET). The type of the FET is not limited. For example, planar FETs may be used in the semiconductor device 100, as well as FinFETs and other types of FETs, such as gate-all-around (GAA) FETs. Source/drain region(s) may refer to a source or a drain, individually or collectively dependent upon the context.

The regions indicated by gates GT may be made of conductive materials such as polysilicon, although this is not a limitation. In some embodiments, the gates GT may include a high-k gate dielectric layer and a metal gate electrode (HKMG). The gates GT, as the name suggests, may serve as the gate terminal of various types of transistors, such as FETs. In the illustrated embodiment, the gates GT extend in the Y-direction and are evenly spaced from each other along the X-direction. A distance between centerlines of two adjacent gates GT is denoted as a gate pitch P. On the intersection of a gate GT and a diffusion region RX, a FET is formed.

The metal MD and metal M0 are electrically conductive and may be made of other types of conductive materials despite being named "metal." The metal MD may serve as local interconnects, such as source/drain contacts. In some embodiments, the metal MD is on a layer that is vertically different from the substrate surface and may serve to connect the doped regions to other elements of the semiconductor device 100, such as metal M0. In some embodiments, the metal MD may extend in the Z-direction; that is, the direction perpendicular to the X-Y plane.

The metal layer M0 exists on a layer vertically separate from the substrate surface, e.g., above the substrate surface. The metal layer M0 may include several electrically separated metal lines that, despite being on substantially the same layer, are used to distribute voltages Vdd1 and Vss, respectively. Vdd1 may be one of the high-voltage VddH and low-voltage VddL, depending on circuit design. Vss provides a ground reference voltage (ground voltage). Not depicted in FIG. 4A, there may be other metal layers (e.g., M1, M2, . . . Mx) suspended above the metal layer M0, such as a total of four to ten metal layers. These metal layers form a frontside power rail to supply voltages from the voltage domain Vdd1 to the semiconductor device 100. In the embodiment illustrated in FIG. 4A, the metal layer M0 includes two metal lines extending in the X-direction distributing the voltage Vdd1 and one metal line therebetween distributing the voltage Vss. The metal lines are electrically connected to the metal MD by vias. In the illustrated embodiment, the top metal line provides the voltage Vdd1 to the source/drain regions of the FETs in the cell C1 and the source/drain regions of some of the FETs in the cell C2 through vias Via-v1; the bottom metal line provides the voltage Vdd1 to the source/drain regions of the FETs in the cell C1' and the source/drain regions of some of the FETs in the cell C2' through vias Via-v1; and the middle metal line is shared by the cells in the top and bottom rows to provide the voltage Vss to the source/drain regions of the FETs in the cells C1-C3 and C1'-C3' through vias Via-g.

FIG. 4B illustrates the backside of the substrate on which the semiconductor device 100 is manufactured. The semiconductor device 100 may include several cells with location corresponding to the cells already indicated in FIG. 4A and boundary indicated by the dashed rectangle. On the backside, different elements may exist.

The diffusion regions RX that can normally be seen from the frontside may also be seen from the backside, depending on the thickness of the substrate; hence, the diffusion regions RX are illustrated in FIG. 4B. In some embodiments, the diffusion regions RX cannot be seen from the backside in the sense that the doping level near the backside surface is different from that near the frontside surface and may be closer to that of the un-doped parts of the substrate; in this case, the regions RX are marked in the schematic illustration of the backside merely to indicate the mirrored location on the backside of the diffusion regions RX made on the frontside.

In the embodiment illustrated in FIG. 4B, the gate materials are normally not made on the backside. Hence, the gate GT in FIG. 4B indicate that gates GT exist in the mirrored location on the frontside (see FIG. 4A) but does not necessarily mean that actual gate materials (such as polysilicon or HKMG) exist on the backside.

The backside metal layer BM0 may exist on the backside of the semiconductor device 100. The backside metal layer BM0 exists on a layer vertically separated from the backside surface of the substrate. e.g., below the backside surface. The backside metal layer BM0 may distribute voltages at different levels. The backside metal layer M0 may include several electrically separated metal lines that, despite being on substantially the same layer, are used to distribute voltages Vdd2 and Vss, respectively. Vdd2 may be one of the high-voltage VddH and low-voltage VddL other than Vdd1, depending on circuit design. Vss provides a ground reference voltage (ground voltage). Not depicted in FIG. 4B, there may be other backside metal layers (e.g., BM1, BM2, . . . BMy) suspended underneath the backside metal layer BM0, such as a total of two to four backside metal layers. These metal layers form a backside power rail to supply voltages from the voltage domain Vdd2 to the semiconductor device 100. In the embodiment illustrated in FIG. 4B, the backside metal layer BM0 includes two metal lines extending in the X-direction distributing the voltage Vdd2 and two metal line therebetween distributing the voltage Vss. The metal lines are electrically connected to the metal MD by backside vias. In the illustrated embodiment, the topmost metal line provides the voltage Vdd2 to the source/drain regions of the FETs in the cell C3 and the source/drain regions of some of the FETs in the cell C2 through vias VB-v2; the bottom metal line provides the voltage Vdd2 to the source/drain regions of the FETs in the cell C3' and the source/drain regions of some of the FETs in the cell C2' through vias VB-v2; and the middle two metal lines provide the voltage Vss to the source/drain regions of the FETs in the top row of cells C1-C3 and the bottom row of cells C1'-C3' through vias VB-g, respectively.

Notably, even though in the depicted embodiment the middle two metal lines providing Vss in the backside metal layer BM0 do not overlap in a top view with the middle metal line providing Vss in the frontside metal layer M0 (vias Via-g and VB-g do not overlap either in a top view), some vias Via-g and VB-g (e.g., Via-g and VB-g in the cells C1 and C3) are landing on the frontside and backside of same source/drain regions through metal MD. Therefore, the frontside metal lines and backside metal lines providing Vss are actually electrically connected. That is, the frontside vias and backside vias help distribution of the voltage VSS to both the frontside and backside of the semiconductor device 100. Further, since the frontside metal lines and backside metal lines providing Vss are electrically connected, some of the cells may be provided Vss from the frontside metal line alone or from the backside metal line alone. For example, in the depicted embodiment, the cell C2 (or C2') receives Vdd1 from the frontside metal layer M0 and Vdd2 from the backside metal layer BM0, but receives Vss only from the frontside metal layer M0 (e.g., no backside vias VB-g in the cell C2 (or C2')). Such a configuration provides extra flexibility in power routing.

Figure 5:
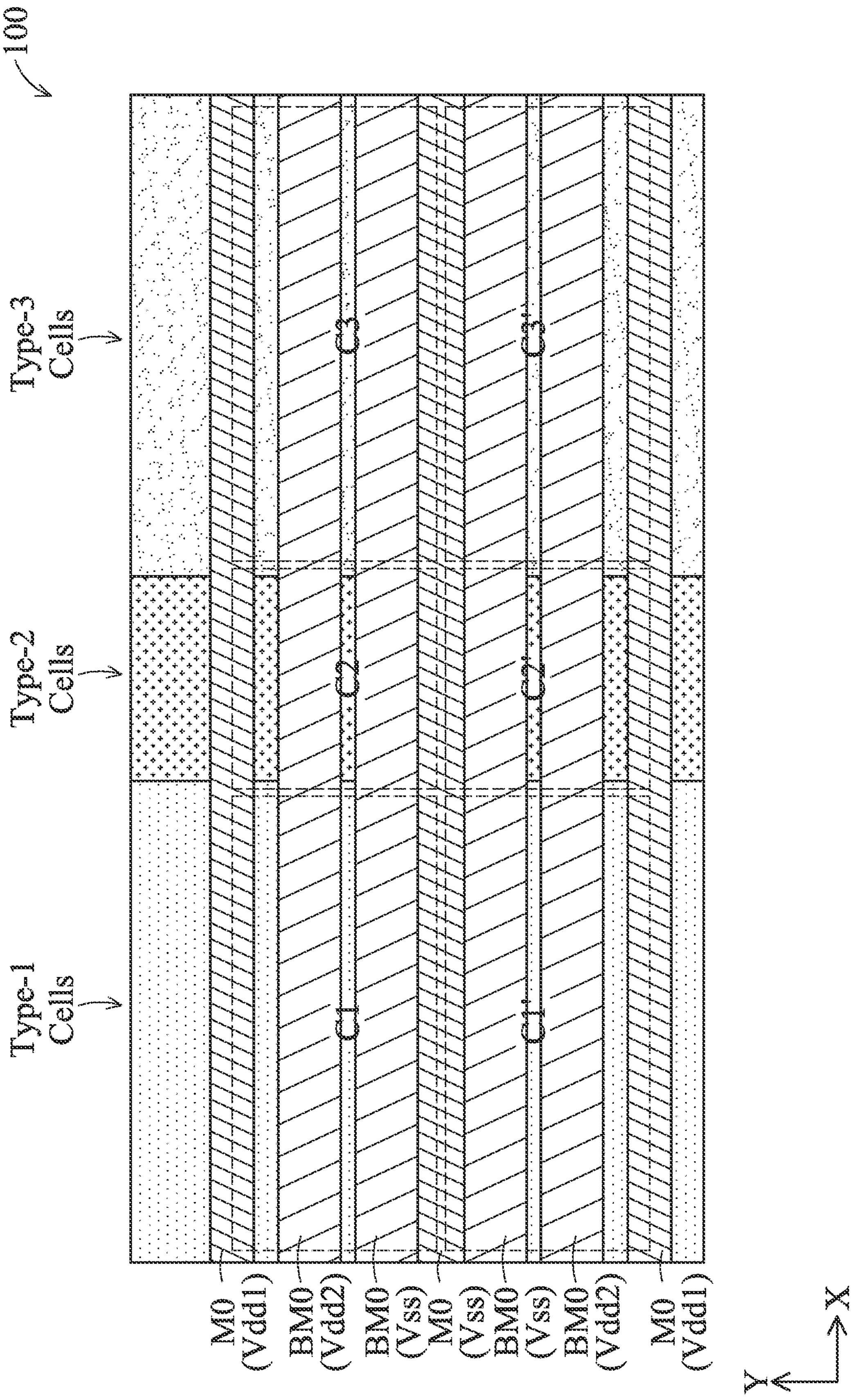
FIG. 5 is a schematic view of the multiple cells functioning at multiple voltage domains in FIGS. 4A and 4B, in accordance with some embodiments of the present disclosure.

FIG. 5 is a schematic view of a semiconductor device 100 in accordance with some embodiments of the present disclosure. In FIG. 5, metal lines in the frontside metal layer M0 and metal lines in the backside metal layer BM0 are depicted together, merely to indicate the locations of the various metal lines in a top view of the semiconductor device 100. In the region of the cells C1-C3 and C1'-C3' as depicted in FIG. 5, each of the frontside and backside metal lines extend in the X-direction and spaced from each other without overlapping in a top view.

Referring to FIG. 5, the semiconductor device 100 includes various type-1, type-2 and type-3 cells. The type-1 cells function under a first voltage domain. The type-2 cells function under a second voltage domain different from the first voltage domain. The type-3 cells function under both the first and second voltage domains. In some embodiments, the first voltage domain is VddH, the second voltage domain is VddL (VddH>VddL>Vss), and the type-3 cells are level shifters to transit signals from the low-voltage domain to the high-voltage domain (e.g., from type-3 cells to type-1 cells). In some embodiments, the first voltage domain is VddL, the second voltage domain is VddH, and the type-3 cells are level shifters to transit signals from the low-voltage domain to the high-voltage domain (e.g., from type-1 cells to type-3 cells). In some embodiments, the combination of the type-1, type-2, and type-3 cells is a portion of a memory device as illustrated in FIGS. 2 and 3, such as a portion of the word line driver 24, GSAE circuitry 30, or I/O circuitry 38 as discussed above.

The type-1 cells (e.g., cells C1, C1') may be provided a first supply voltage, such as Vdd1, and a ground reference voltage, such as Vss. Metal lines in the frontside metal layer M0 (and higher metal lines in M2, . . . Mx if presented) provide the first supply voltage Vdd1 and the ground reference voltage Vss through frontside vias. The type-3 cells (e.g., cells C3, C3') may be provided a second supply voltage, such as Vdd2, and a ground reference voltage, such as Vss. Metal lines in the backside metal layer BM0 (and lower metal lines in BM2, . . . BMy if presented) provide the second supply voltage Vdd2 and the ground reference voltage Vss through backside vias. The type-2 cells (e.g., cells C2, C2') may be provided both the first supply voltage Vdd1 and the second supply voltage Vdd2. Metal lines in the frontside metal layer M0 (and higher metal lines in M2, . . . Mx if presented) provide the corresponding first supply voltage Vdd1 through frontside vias, and metal lines in the backside metal layer BM0 (and lower metal lines in BM2, . . . BMy if presented) provide the corresponding second supply voltage Vdd2 through backside vias. In some embodiments, Vdd1 is high-voltage VddH and Vdd2 is low-voltage VddL; yet in some alternative embodiments, Vdd1 is low-voltage VddL and Vdd2 is high-voltage VddH, depending on design needs. The backside metal lines are wider than the frontside metal lines in the depicted embodiment, which reduces metal routing resistance on the backside of the semiconductor device 100.

Either the metal lines in the frontside or the metal lines in the backside, or both, may provide the ground reference voltage Vss to the type-2 cells. Further, since the frontside and backside metal lines carrying the ground reference voltage Vss are electrically connected, either of the type-1, type-2, and type-3 cells may be provided the ground reference voltage Vss directly from the frontside metal line alone, or the backside metal line alone, or both. For example, the cell C3 (or C3') may be provided with the second supply voltage Vdd2 from the backside metal lines in the BM0 layer, but the ground reference voltage Vss from the frontside metal lines in the M0 layer. Similarly, the cell C1 (or C1') may be provided with the first supply voltage Vdd1 from the frontside metal lines in the M0 layer, but the ground reference voltage Vss from the backside metal lines in the BM0 layer. Such a configuration provides extra flexibility in power routing.

Figure 6:
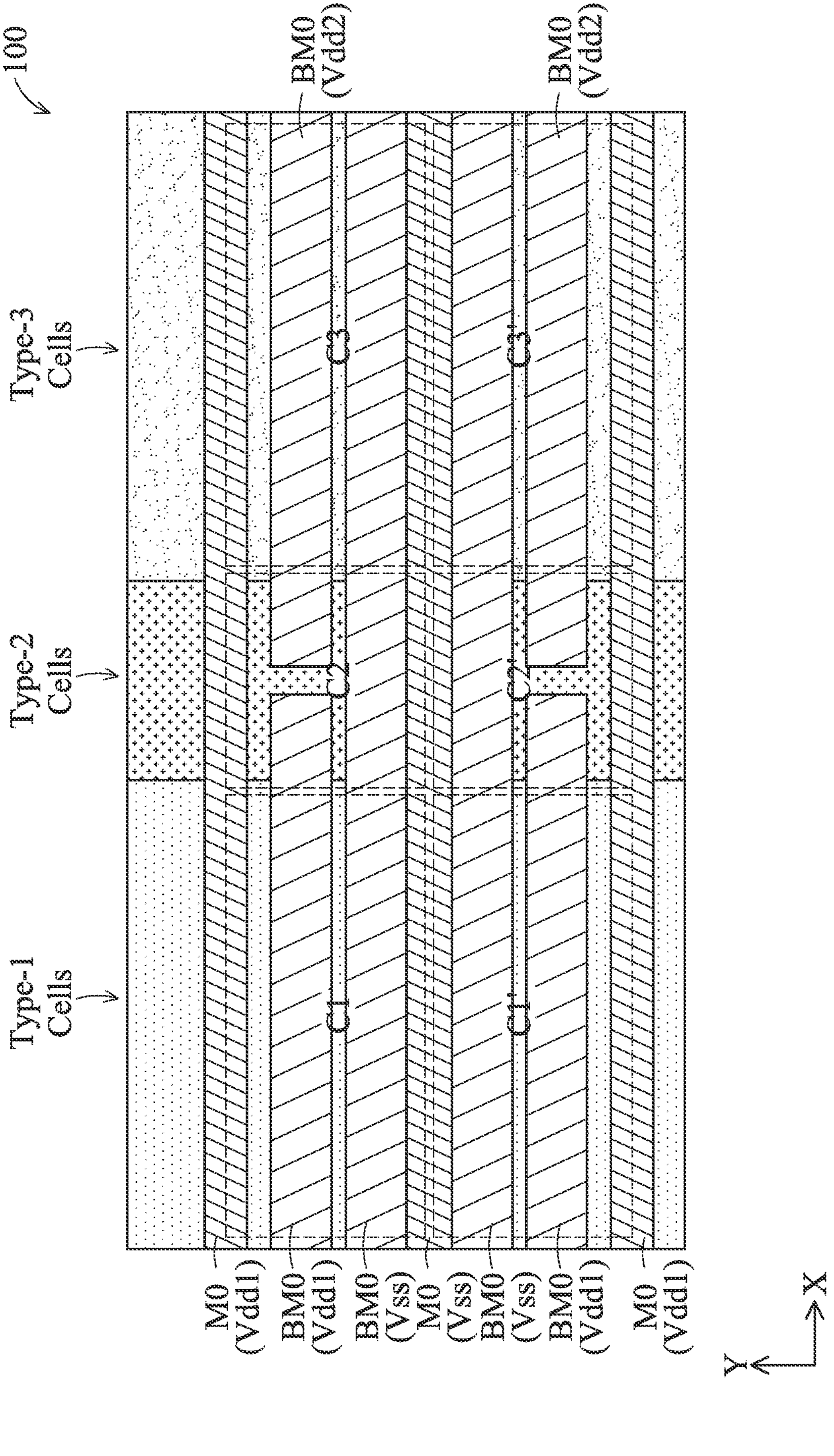
FIG. 6 is an alternative schematic view of the multiple cells functioning at multiple voltage domains in FIGS. 4A and 4B, in accordance with some embodiments of the present disclosure.

In the embodiment illustrated in FIG. 5, the semiconductor device 100 receives Vdd1 from the frontside metal lines alone and Vdd2 from the backside metal lines alone. In alternative embodiments, the semiconductor device 100 may receive Vdd2 from the backside metal lines alone but Vdd1 from both the frontside and backside metal lines. Such an alternative embodiment is illustrated in FIG. 6. Referring to FIG. 6, the otherwise continuous backside metal lines in the BM0 layer carrying Vdd2 in FIG. 5 are divided into two segments, one still carrying Vdd2 and another one carrying Vdd1. In other words, the backside metal lines in the BM0 layer do not extend all the way through the regions of the type-2 and type-1 cells but remain in the region of the type-3 cell and portion of the region of the type-2 cells abut the type-3 cells. The backside metal lines in the BM0 layer in the region of the type-1 cells and portion of the region of the type-2 cells abut the type-1 cells carry Vdd1 instead. Thus, the FETs in the type-1 cells and portion of the type-2 cells receive Vdd1 from both the frontside and backside metal lines through frontside and backside vias (vias not shown in FIG. 6). As a comparison, the FETs in the type-3 cells and other portion of the type-2 cells receive Vdd2 from the backside metal lines alone. When Vdd1 domain is the high-voltage domain, such a configuration effectively reduces the resistance of power routing and reduces the power dissipated by the power rails by powering FETs from both the frontside and backside power rails. The frontside metal lines in the M0 layer may still extend through the regions of type-1, type-2, and type-3 cells, as shown in FIG. 6.

Figure 7:
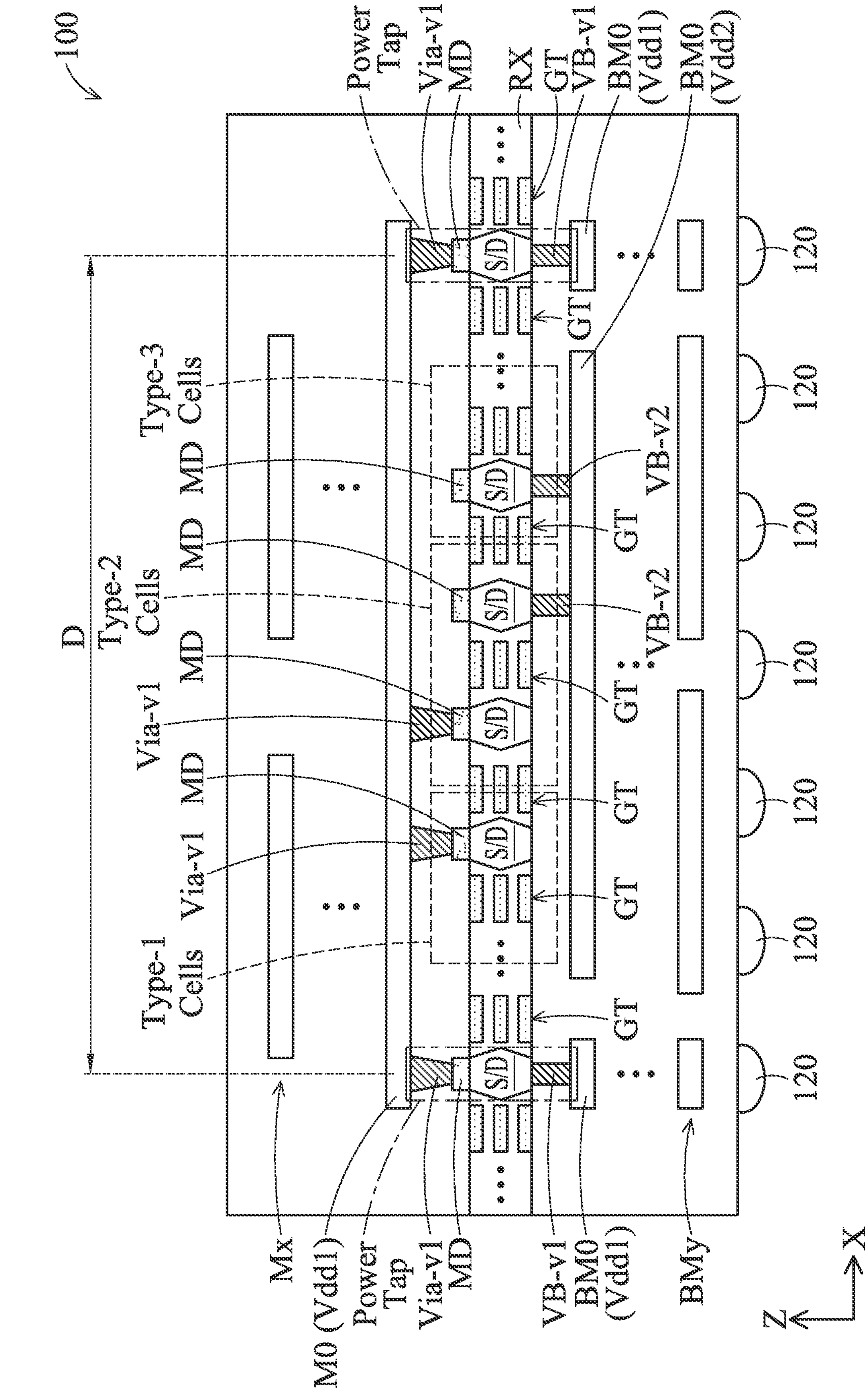
FIGS. 7, 8, 9, and 10 are cross-sectional views of a region of a semiconductor device, in accordance with some embodiments of the present disclosure.

FIG. 7 illustrates a cross-sectional view of a semiconductor device 100 corresponding to the layout in FIG. 5, according to some embodiments. The semiconductor device 100 includes a frontside interconnect structure formed on the frontside of a substrate. FETs are formed in the frontside of the substrate. The frontside interconnect structure includes frontside metal layers M0 . . . Mx. In some embodiments, the frontside interconnect structure includes four to ten metal layers. The metal lines and vias in the frontside interconnect structure provides a frontside power rail. The semiconductor device 100 also includes a backside interconnect structure on the backside of the substrate. The backside interconnect structure includes backside metal layers BM0 . . . BMy. In some embodiments, the backside interconnect structure includes two to four metal layers. In some embodiments, the number of metal layers in the backside interconnect structure is less than in the frontside. The metal lines and vias in the backside interconnect structure provides a backside power rail.

The semiconductor device 100 also includes package bumps 120. The package bumps 120 provide electrical connection between the semiconductor device 100 and external power supplies. In other words, the voltages (e.g., VddH, VddL, and Vss) of different voltage domains are brought into the semiconductor device 100 from the package bumps 120. In the illustrated embodiment, the package bumps 120 are deposited on the backside of the semiconductor device 100. Therefore, the voltages from different voltage domains are first passed to the backside power rail from the package bumps 120, and some of the voltages are further passed to the frontside power rail from the backside power rail through power taps that extend through the substrate. Alternatively, the package bumps 120 may be deposited on the frontside of the semiconductor device 100. Accordingly, the voltages from different voltage domains are passed to the frontside power rail from the package bumps 120, and some of the voltages are further passed to the backside power rail from the frontside power rail through power taps that extend through the substrate. Whether the package bumps 120 are provided on the frontside or backside of the semiconductor device 100 may depend on design needs.

Still referring to FIG. 7, the diffusion region RX is formed in the substrate. The gate materials GT indicated as the stacks of small rectangles within the diffusion region RX indicate the gates implemented in gate-all-around (GAA) FETs. However, implementation of the FETs in other types of FETs, such as planar FET and FinFET, is also possible. Source/drain (S/D) regions are formed in the diffusion region RX and interpose adjacent gates GT. In some embodiments, source/drain regions are formed of doped epitaxial features.

In the illustrated embodiment, to pass the voltage Vdd1 to the frontside power rail from the backside power rail, a conductive path is provided between the backside metal line in BM0 and the frontside metal line in M0. The conductive path includes a backside via VB-v1, a source/drain region contacting the backside via VB-v1, a source/drain contact MD contacting the source/drain region, and a frontside via Via-v1 contacting the source/drain contact MD. The conductive path is also referred to as a power tap. A power tap pitch D (distance between two adjacent power taps) may range from about 20 times to 40 times of the gate pitch P (FIG. 4A). The range is not arbitrary. If the power tap pitch D is smaller than 20 times of the gate pitch P, the space between two power taps may be not enough to layout functional cells (e.g., type-1, type-2, and type-3 cells). If the power tap pitch D is larger than 40 times of the gate pitch P, the number of power taps may be not enough and the resistance of the Vdd1 voltage domain may be too large. The power taps are located outside of the region hosting type-1, type-2, and type-3 cells in the illustrated embodiment. Alternatively, the power taps may be part of the region hosting type-1, type-2, and type-3 cells. In the depicted embodiment in FIG. 7, the backside metal lines in BM0 . . . BMy carrying Vdd1 and backside vias therebetween form islands of voltage domain Vdd1, separated from other portions of backside power rail that carries Vdd2, without powering any functional cells from the backside of the semiconductor device 100.

In the illustrated embodiment, between the power taps, type-1, type-2, and type-3 cells are laid side-by-side. The type-2 cell functions as level shifters between the type-1 and type-3 cells. The frontside metal line in the M0 layer delivers Vdd1 to the type-1 cells and a portion of the type-2 cells. The backside metal line in the BM0 layer not part of the power taps receives Vdd2 from the package bumps 120 and delivers Vdd2 to the type-3 cells and other portion of the type-2 cells. As discussed above, in a top view of the region hosting type-1, type-2, and type-3 cells, the frontside metal lines and backside metal lines are not overlapped. FIG. 7 overlays the frontside metal lines and backside metal lines in one cross-sectional view for the sake of illustration purpose.

Figure 8:
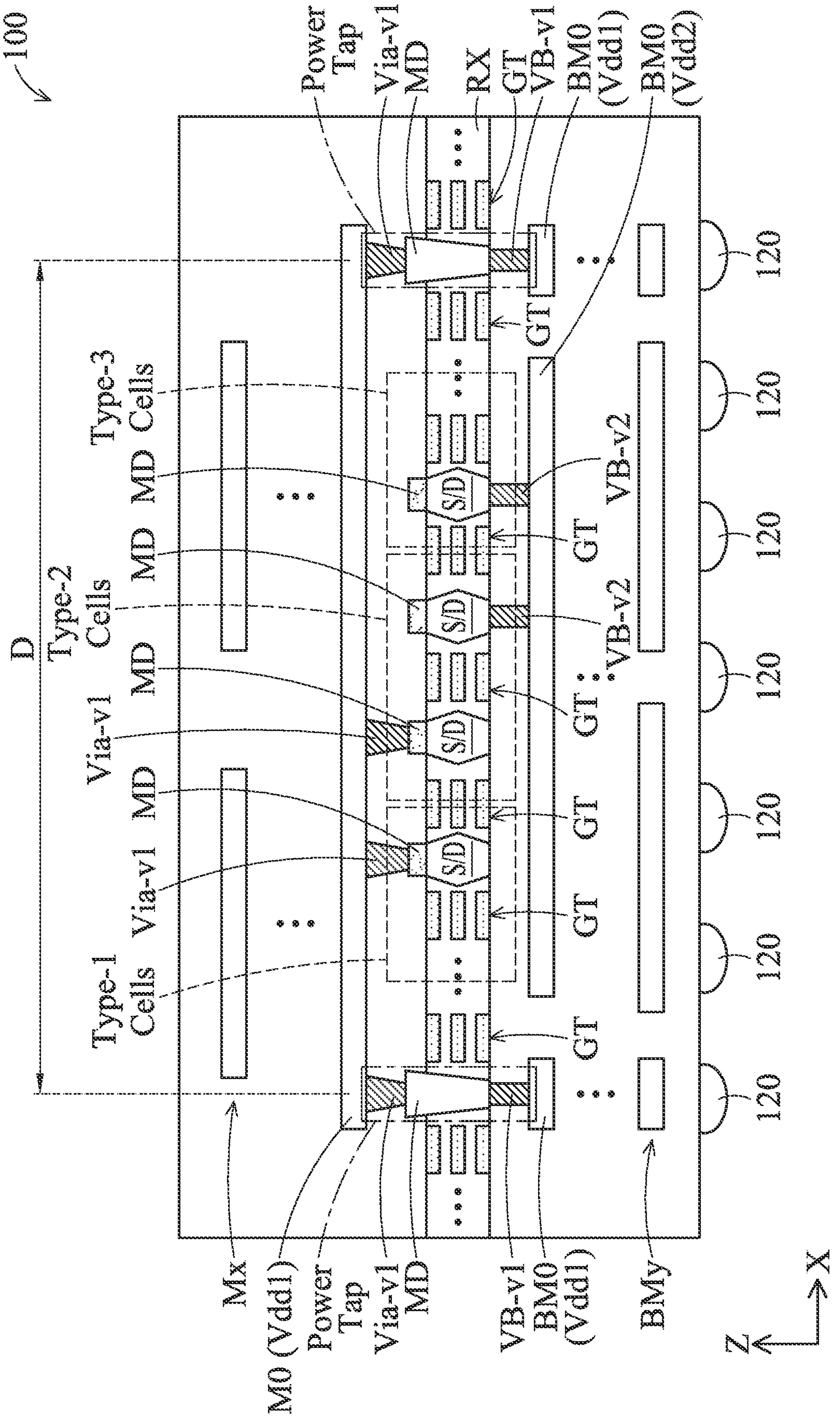

FIG. 8 illustrates a different structure of the power taps for the embodiment in FIG. 7. Different from the power taps in FIG. 7, there is no source/drain region in the power taps in FIG. 8. The depicted power tap includes the backside via VB-v1, a metal MD contacting the backside via VB-v1, and a frontside via Via-v1 contacting the metal MD. The metal MD extends through the substrate. In some embodiments, the metal MD is a through-substrate via (TSV).

Figure 9:
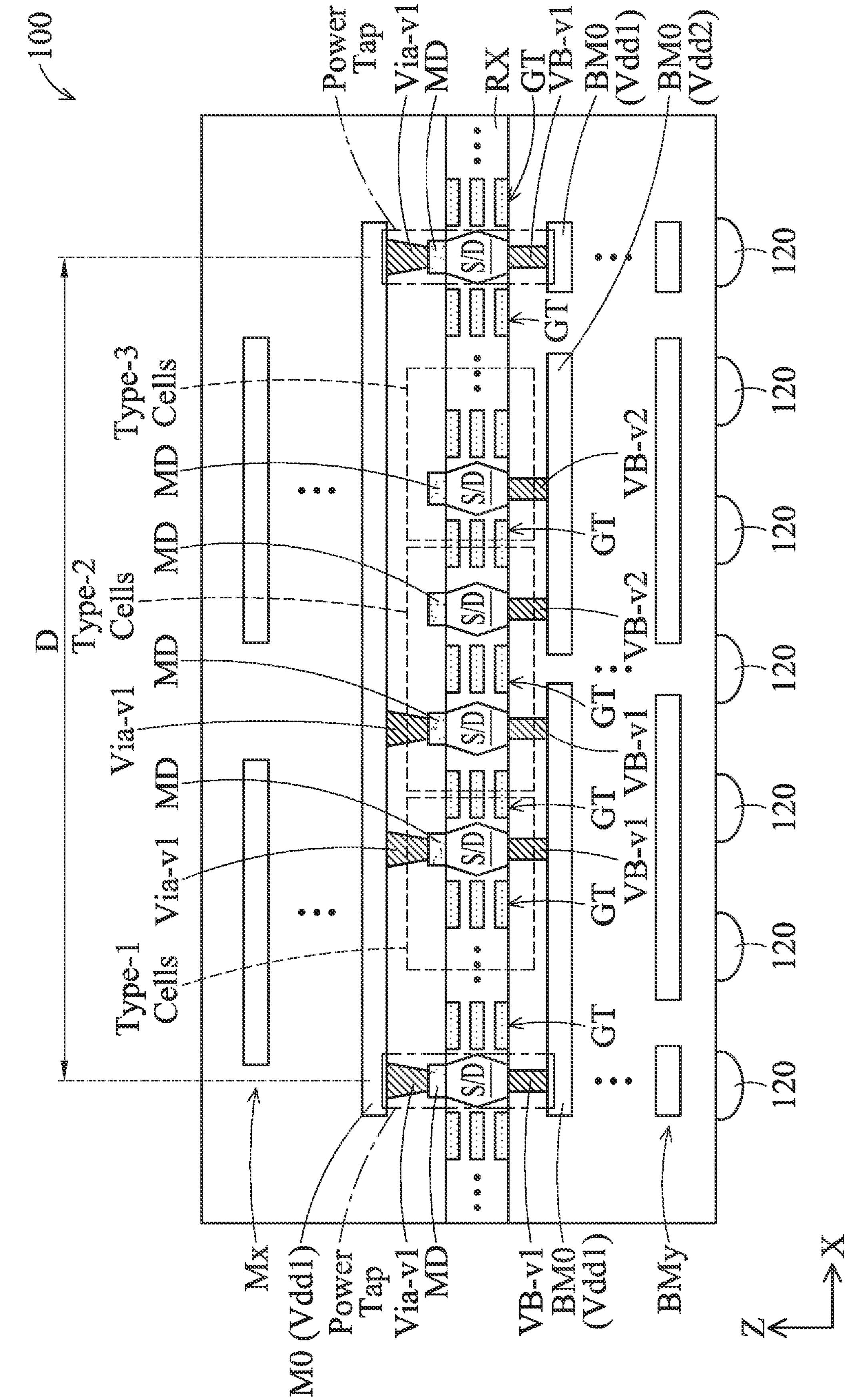

FIG. 9 illustrates a cross-sectional view of a semiconductor device 100 corresponding to the layout in FIG. 6, according to some embodiments. For reasons of clarity and consistency, similar elements appearing in FIG. 9 are labeled the same as in FIG. 7, and the details of these elements are not necessarily repeated again below. One difference between the embodiments in FIGS. 7 and 9 is that, in FIG. 9 the otherwise continuous backside metal line in the BM0 layer carrying Vdd2 is divided into two segments, one still carrying Vdd2 and another one carrying Vdd1. In other words, the backside metal line in the BM0 layer do not extend all the way through the regions of the type-2 and type-1 cells but remain in the region of the type-3 cell and portion of the region of the type-2 cells abut the type-3 cells. The backside metal line in the BM0 layer in the region of the type-1 cells and portion of the region of the type-2 cells abut the type-1 cells carry Vdd1 instead. The power taps may directly land on the backside metal line in the BM0 layer carrying Vdd1. Thus, the FETs in the type-1 cells and portion of the type-2 cells receive Vdd1 from both the frontside and backside metal lines through frontside vias Via-v1 and backside vias VB-v1. As a comparison, the FETs in the type-3 cells and other portion of the type-2 cells receive Vdd2 from the backside metal lines alone through backside vias VB-v2. When Vdd1 domain is the high-voltage domain, such a configuration effectively reduces the resistance of power routing and reduces the power dissipated by the power rails by powering FETs from both the frontside and backside power rails. The frontside metal lines in the M0 layer may still extend through the regions of type-1, type-2, and type-3 cells, as shown in FIG. 9.

Figure 10:
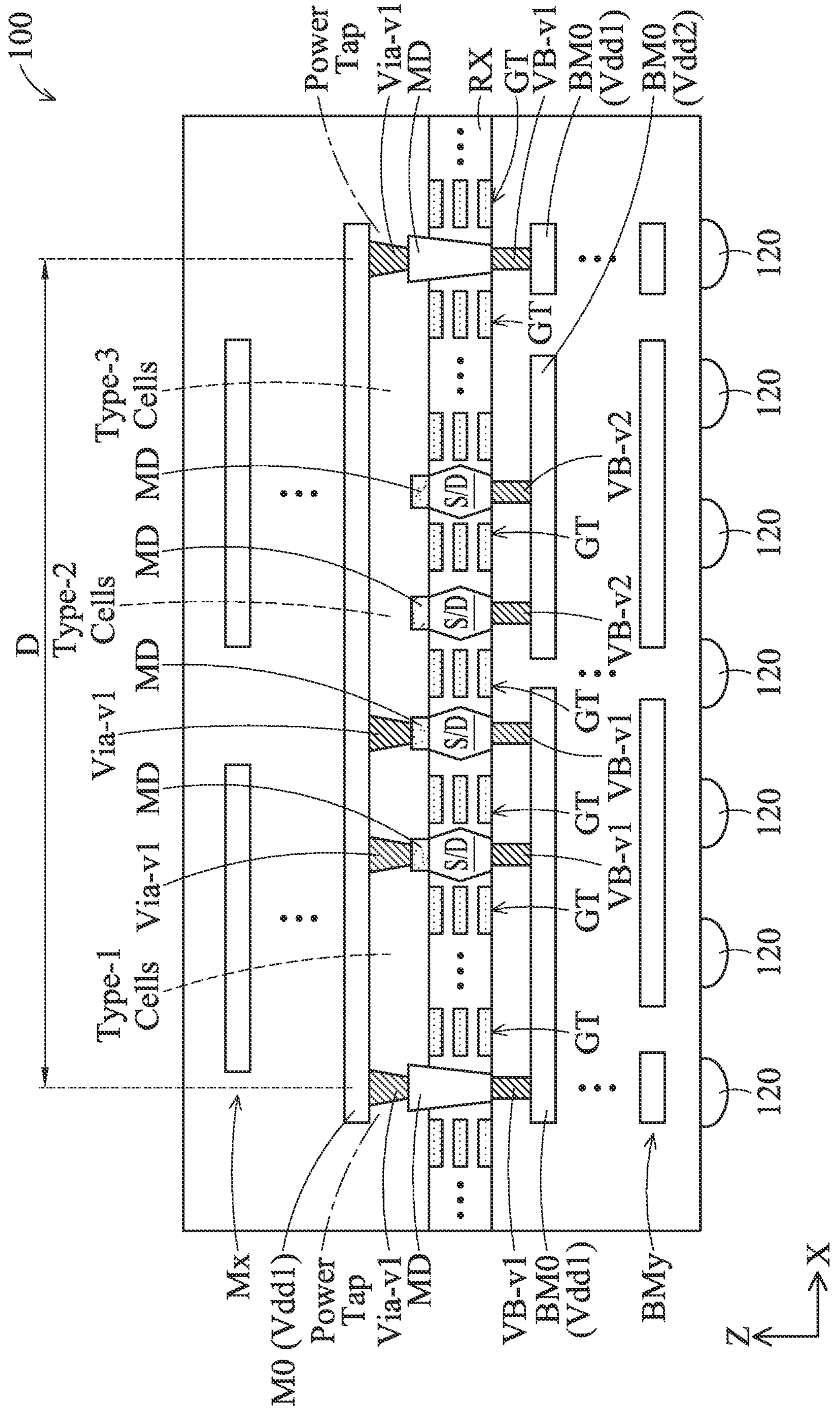

FIG. 10 illustrates a different structure of the power taps for the embodiment in FIG. 9. Different from the power taps in FIG. 9, there is no source/drain region in the power taps in FIG. 10. The depicted power tap includes the backside via VB-v1, a metal MD contacting the backside via VB-v1, and a frontside via Via-v1 contacting the metal MD. The metal MD extends through the substrate. In some embodiments, the metal MD is a through-substrate via (TSV).

By forming the backside power rail, distributing voltages from multiple voltage domains to different regions of a semiconductor device at cell level (e.g., among the cells C1-C3) or transistor level (e.g., inside the cell C2) becomes more feasible. Power routing is simplified, and resistance in the power rails also decreases, which leads to less power dissipated in the power rails and less leakage power in the semiconductor device. Further, embodiments of the present disclosure can be readily integrated into existing semiconductor manufacturing processes.

In one exemplary aspect, the present disclosure is directed to a semiconductor device. The semiconductor device includes a plurality of transistors formed in a substrate, the plurality of transistors forming at least a first cell functioning under a first power supply voltage and a second cell functioning under a second power supply voltage that is different from the first power supply voltage, a frontside power rail disposed on a frontside of the substrate, the frontside power rail providing the first power supply voltage to the first cell, and a backside power rail disposed on a backside of the substrate, the backside power rail providing the second power supply voltage to the second cell. In some embodiments, the semiconductor device further includes package bumps providing the first power supply voltage and the second power supply voltage to the semiconductor device, and power taps contacting the frontside power rail and electrically coupling the frontside power rail to a portion of the package bumps that provides the first power supply voltage. In some embodiments, a pitch of the power taps is about 20 times to about 40 times of a pitch of gate structures in the plurality of transistors. In some embodiments, one of the power taps includes a source/drain feature, a source/drain contact disposed on the source/drain feature, and a backside via disposed under the source/drain feature. In some embodiments, one of the power taps includes a through substrate via and a backside via contacting the through substrate via. In some embodiments, the plurality of transistors also form a third cell functioning under both the first power supply voltage and the second power supply voltage, the frontside power rail providing the first power supply voltage to the third cell, and the backside power rail providing the second power supply voltage to the third cell. In some embodiments, the third cell is positioned between the first cell and the second cell and functions as a level shifter. In some embodiments, the backside power rail is also configured to provide the first power supply voltage to the first cell. In some embodiments, the frontside power rail includes a first frontside metal line providing the first power supply voltage and a second frontside metal line parallel to the first frontside metal line and providing a ground reference voltage, the backside power rail including a first backside metal line providing the second power supply voltage and a second backside metal line parallel to the first backside metal line and providing the ground reference voltage, and the first and second backside metal lines being sandwiched by the first and second frontside metal lines. In some embodiments, the first and second backside metal lines are wider than the first and second frontside metal lines.

In another exemplary aspect, the present disclosure is directed to a semiconductor device. The semiconductor device includes a plurality of active regions formed on a substate, each of the active regions extending lengthwise in a first direction, a plurality of gate structures disposed above the active regions, each of the gate structures extending lengthwise in a second direction perpendicular to the first direction, a first frontside metal line disposed above the gate structures and extending lengthwise in the first direction, the first frontside metal line carrying a first power supply voltage, a second frontside metal line disposed above the gate structures and extending lengthwise in the first direction, the second frontside metal line carrying a ground reference voltage, a first backside metal line disposed underneath the substrate and extending lengthwise in the first direction, the first backside metal line carrying a second power supply voltage that is different from the first power supply voltage, and a second backside metal line disposed underneath the substrate and extending lengthwise in the first direction, the second backside metal line carrying the ground reference voltage. In some embodiments, the first backside metal line and the second backside metal line are disposed between the first frontside metal line and the second frontside metal line in a top view. In some embodiments, the first backside metal line, the second backside metal line, the first frontside metal line, and the second frontside metal line have no overlaps in the top view. In some embodiments, the active regions include a first source/drain region and a second source/drain region, and the first frontside metal line is electrically coupled to the first source/drain region and the first backside metal line is electrically coupled to the second source/drain region. In some embodiments, the active regions also include a third source/drain region, and the second frontside metal line and the second backside metal line are both electrically coupled to the third source/drain region. In some embodiments, the semiconductor device further includes a third backside metal line disposed underneath the substrate and extending lengthwise in the first direction, the third backside metal line carrying the first power supply voltage. In some embodiments, the active regions include a source/drain region, and the first frontside metal line and the third backside metal line are both electrically coupled to the source/drain region.

In yet another exemplary aspect, the present disclosure is directed to a level shifting circuit. The level shifting circuit includes a plurality of transistors configured to convert a signal of a first voltage level to a second voltage level that is higher than the first voltage level, a frontside power line disposed above the transistors, the frontside power line delivering the first voltage level to a first source/drain region of the transistors, and a backside power line disposed under the transistors, the backside power line delivering the second voltage level to a second source/drain region of the transistors. In some embodiments, a width of the backside power line is larger than a width of the frontside power line. In some embodiments, the level shifting circuit further includes another backside power line disposed under the transistors and configured to deliver the first voltage level to the first source/drain region of the transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a plurality of transistors formed in a substrate, the plurality of transistors forming at least a first cell functioning under a first power supply voltage and a second cell functioning under a second power supply voltage that is different from the first power supply voltage;

a frontside power rail disposed on a frontside of the substrate, the frontside power rail providing the first power supply voltage to the first cell;

a backside power rail disposed on a backside of the substrate, the backside power rail providing the second power supply voltage to the second cell;

package bumps configured to provide the first power supply voltage and the second power supply voltage to the semiconductor device; and power taps contacting the frontside power rail and electrically coupling the frontside power rail to a portion of the package bumps configured to provide the first power supply voltage.

2. The semiconductor device of claim 1, wherein a pitch of the power taps is about 20 times to about 40 times of a pitch of gate structures in the plurality of transistors.

3. The semiconductor device of claim 1, wherein one of the power taps includes a source/drain feature, a source/drain contact disposed on the source/drain feature, and a backside via disposed under the source/drain feature.

4. The semiconductor device of claim 1, wherein one of the power taps includes a through substrate via and a backside via contacting the through substrate via.

5. The semiconductor device of claim 1, wherein the plurality of transistors also form a third cell functioning under both the first power supply voltage and the second power supply voltage, wherein the frontside power rail provides the first power supply voltage to the third cell, and the backside power rail provides the second power supply voltage to the third cell.

6. The semiconductor device of claim 5, wherein the third cell is positioned between the first cell and the second cell and functions as a level shifter.

7. The semiconductor device of claim 1, wherein the backside power rail is also configured to provide the first power supply voltage to the first cell.

8. The semiconductor device of claim 1, wherein the frontside power rail includes a first frontside metal line providing the first power supply voltage and a second frontside metal line parallel to the first frontside metal line and providing a ground reference voltage, wherein the backside power rail includes a first backside metal line providing the second power supply voltage and a second backside metal line parallel to the first backside metal line and providing the ground reference voltage, and wherein the first and second backside metal lines are sandwiched by the first and second frontside metal lines.

9. The semiconductor device of claim 8, wherein the first and second backside metal lines are wider than the first and second frontside metal lines.

10. A semiconductor device, comprising:

a plurality of active regions formed on a substrate, each of the active regions extending lengthwise in a first direction;

a plurality of gate structures disposed above the active regions, each of the gate structures extending lengthwise in a second direction perpendicular to the first direction;

a first frontside metal line disposed above the gate structures and extending lengthwise in the first direction, the first frontside metal line carrying a first power supply voltage;

a second frontside metal line disposed above the gate structures and extending lengthwise in the first direction, the second frontside metal line carrying a ground reference voltage;

a first backside metal line disposed underneath the substrate and extending lengthwise in the first direction, the first backside metal line carrying a second power supply voltage that is different from the first power supply voltage; and a second backside metal line disposed underneath the substrate and extending lengthwise in the first direction, the second backside metal line carrying the ground reference voltage.

11. The semiconductor device of claim 10, wherein the first backside metal line and the second backside metal line are disposed between the first frontside metal line and the second frontside metal line in a top view.

12. The semiconductor device of claim 11, wherein the first backside metal line, the second backside metal line, the first frontside metal line, and the second frontside metal line have no overlaps in the top view.

13. The semiconductor device of claim 10, wherein the active regions include a first source/drain region and a second source/drain region, and wherein the first frontside metal line is electrically coupled to the first source/drain region and the first backside metal line is electrically coupled to the second source/drain region.

14. The semiconductor device of claim 13, wherein the active regions also include a third source/drain region, and wherein the second frontside metal line and the second backside metal line are both electrically coupled to the third source/drain region.

15. The semiconductor device of claim 10, further comprising:

a third backside metal line disposed underneath the substrate and extending lengthwise in the first direction, the third backside metal line carrying the first power supply voltage.

16. The semiconductor device of claim 15, wherein the active regions include a source/drain region, and wherein the first frontside metal line and the third backside metal line are both electrically coupled to the source/drain region.

17. A level shifting circuit, comprising:

a plurality of transistors configured to convert a signal of a first voltage level to a second voltage level that is higher than the first voltage level;

a frontside power line disposed above the transistors, the frontside power line delivering the first voltage level to a first source/drain region of the transistors;

a frontside ground line disposed above the transistors, the frontside ground line configured to deliver a ground reference voltage to the transistors, the frontside ground line extending lengthwise in a first direction;

a backside power line disposed under the transistors, the backside power line delivering the second voltage level to a second source/drain region of the transistors; and a backside ground line disposed under the transistors, the backside ground line configured to deliver the ground reference voltage to the transistors, the backside ground line extending lengthwise in the first direction.

18. The level shifting circuit of claim 17, wherein a width of the backside power line is larger than a width of the frontside power line.

19. The level shifting circuit of claim 17, further comprising:

another backside power line disposed under the transistors and configured to deliver the first voltage level to the first source/drain region of the transistors.

20. The level shifting circuit of claim 17, wherein a width of the backside ground line is larger than a width of the frontside ground line.

* * * * *